(12) United States Patent
De Bonis et al.

(10) Patent No.: US 10,049,971 B2
(45) Date of Patent: Aug. 14, 2018

(54) PACKAGE STRUCTURE TO ENHANCE YIELD OF TMI INTERCONNECTIONS

(71) Applicant: Intel Corporation, Santa Clara, CA (US)

(72) Inventors: Thomas J. De Bonis, Tempe, AZ (US); Lilia May, Chandler, AZ (US); Rajen S. Sidhu, Chandler, AZ (US); Mukul P. Renavikar, Chandler, AZ (US); Ashay A. Dani, Chandler, AZ (US); Edward R. Prack, Phoenix, AZ (US); Carl L. Deppisch, Chandler, AZ (US); Anna M. Prakash, Chandler, AZ (US); James C. Matayabas, Gilber, AZ (US); Jason Jieping Zhang, Chandler, AZ (US); Srinivasa R. Aravamudhan, Beaverton, OR (US); Chang Lin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/478,064

(22) Filed: Apr. 3, 2017

(65) Prior Publication Data
US 2017/0207152 A1    Jul. 20, 2017

Related U.S. Application Data

(62) Division of application No. 14/198,479, filed on Mar. 5, 2014, now Pat. No. 9,613,933.

(51) Int. Cl.
*H01L 21/00* (2006.01)
*H01L 23/498* (2006.01)
(Continued)

(52) U.S. Cl.
CPC .... *H01L 23/49816* (2013.01); *H01L 21/4853* (2013.01); *H01L 21/565* (2013.01);
(Continued)

(58) Field of Classification Search
CPC ............. H01L 21/565; H01L 21/76802; H01L 21/76877; H01L 24/11; H01L 24/17;
(Continued)

(56) References Cited

U.S. PATENT DOCUMENTS

| 6,504,242 B1 | 1/2003 | Deppisch |
| 6,597,575 B1 | 7/2003 | Matayabas et al. |

(Continued)

FOREIGN PATENT DOCUMENTS

| JP | 2013-143570 | 7/2013 |
| JP | 2013-225638 | 10/2013 |
| KR | 20090083129 | 3/2009 |

*Primary Examiner* — Long K Tran
(74) *Attorney, Agent, or Firm* — Schwabe, Williamson & Wyatt P.C.

(57) ABSTRACT

An apparatus is described that includes a substrate and a mold compound disposed on the substrate. The semiconductor die is embedded within the mold compound and is electrically coupled to lands on the substrate. Solder balls are disposed around the semiconductor die on the substrate. Each of the solder balls have a solid coating thereon. The solid coating contains a cleaning agent to promote its solder ball's coalescence with another solder ball. Respective vias are formed in the mold compound that expose the solder balls and their respective solid coatings. In combined or alternate embodiments outer edges of the mold compound have smaller thickness than regions of the mold compound between the vias and the semiconductor die. In combined or alternate embodiments micro-channels exist between the solder balls and the mold compound.

3 Claims, 9 Drawing Sheets

(51) Int. Cl.
   *H01L 25/065* (2006.01)
   *H01L 23/31* (2006.01)
   *H01L 25/10* (2006.01)
   *H01L 21/48* (2006.01)
   *H01L 21/56* (2006.01)
   *H01L 21/768* (2006.01)
   *H01L 25/00* (2006.01)
   *H01L 23/00* (2006.01)

(52) U.S. Cl.
   CPC .... *H01L 21/76802* (2013.01); *H01L 23/3128* (2013.01); *H01L 23/49822* (2013.01); *H01L 24/17* (2013.01); *H01L 25/0657* (2013.01); *H01L 25/105* (2013.01); *H01L 25/50* (2013.01); *H01L 24/16* (2013.01); *H01L 2224/13023* (2013.01); *H01L 2224/16227* (2013.01); *H01L 2224/16238* (2013.01); *H01L 2225/0652* (2013.01); *H01L 2225/06513* (2013.01); *H01L 2225/06517* (2013.01); *H01L 2225/06548* (2013.01); *H01L 2225/06586* (2013.01); *H01L 2924/12042* (2013.01); *H01L 2924/15331* (2013.01); *H01L 2924/181* (2013.01); *H01L 2924/37001* (2013.01)

(58) Field of Classification Search
   CPC . H01L 2224/11849; H01L 2224/13025; H01L 2224/16225
   USPC .......................................................... 438/126
   See application file for complete search history.

(56) References Cited

U.S. PATENT DOCUMENTS

| | | |
|---|---|---|
| 6,723,627 B1 | 4/2004 | Kariyazaki et al. |
| 6,974,723 B2 | 12/2005 | Matayabas |
| 7,014,093 B2 | 3/2006 | Houle |
| 7,036,573 B2 | 5/2006 | Koning |
| 7,170,188 B2 | 1/2007 | Matayabas et al. |
| 7,252,877 B2 | 8/2007 | Jayaraman et al. |
| 7,253,523 B2 | 8/2007 | Dani |
| 7,436,058 B2 | 10/2008 | Hua |
| 7,527,090 B2 | 5/2009 | Dani |
| 7,851,894 B1 | 12/2010 | Scanlan |
| 8,162,203 B1 | 4/2012 | Gruber et al. |
| 8,305,766 B2 | 11/2012 | Park |
| 8,339,796 B2 | 12/2012 | Lee et al. |
| 8,552,305 B2 | 10/2013 | Park |
| 8,671,564 B2 | 3/2014 | Oh |
| 8,692,391 B2 | 4/2014 | Jeong |
| 8,736,077 B2 | 5/2014 | Kim |
| 8,809,181 B2 | 8/2014 | Sodhu |
| 8,826,527 B2 | 9/2014 | Park |
| 8,881,382 B2 | 11/2014 | Lee et al. |
| 8,896,110 B2 | 11/2014 | Hu |
| 8,920,934 B2 | 12/2014 | Jiang |
| 8,942,004 B2 | 1/2015 | Hong |
| 8,981,549 B2 | 3/2015 | Kim et al. |
| 2001/0008160 A1 | 7/2001 | Suzuki et al. |
| 2007/0090160 A1 | 4/2007 | Masumoto |
| 2008/0078810 A1 | 4/2008 | Kkawamura et al. |
| 2010/0224993 A1 | 9/2010 | Swaminathan |
| 2010/0288535 A1 | 11/2010 | Hong et al. |
| 2010/0314755 A1 | 12/2010 | Kang |
| 2011/0061922 A1 | 3/2011 | Lee |
| 2011/0067901 A1 | 3/2011 | Kim |
| 2011/0076472 A1 | 3/2011 | Kim |
| 2011/0083891 A1 | 4/2011 | We et al. |
| 2011/0083892 A1 | 4/2011 | We et al. |
| 2011/0097856 A1 | 4/2011 | Kim |
| 2011/0127076 A1 | 6/2011 | Kim |
| 2011/0147668 A1 | 6/2011 | Kim et al. |
| 2011/0156241 A1 | 6/2011 | Hong |
| 2011/0164391 A1 | 7/2011 | Shin |
| 2011/0194007 A1 | 8/2011 | Kim et al. |
| 2011/0240927 A1 | 10/2011 | Kim et al. |
| 2012/0087098 A1 | 4/2012 | Lee |
| 2012/0119358 A1 | 5/2012 | Oh |
| 2012/0127681 A1 | 5/2012 | Ryu |
| 2012/0153473 A1 | 6/2012 | Lee |
| 2012/0160550 A1 | 6/2012 | Jeong |
| 2012/0161323 A1 | 6/2012 | Kim |
| 2012/0319274 A1 | 12/2012 | Tanaka et al. |
| 2013/0178016 A1 | 7/2013 | Yim et al. |
| 2013/0270685 A1 | 10/2013 | Yim et al. |
| 2013/0341379 A1 | 12/2013 | Sidhu |
| 2014/0027885 A1 | 1/2014 | Kawase et al. |
| 2014/0084461 A1 | 3/2014 | Sidhu |
| 2014/0124925 A1 | 5/2014 | Sidhu |
| 2014/0138826 A1 | 5/2014 | Kumar |
| 2014/0151096 A1 | 6/2014 | Jiang |
| 2014/0170815 A1 | 6/2014 | Jeong |
| 2014/0175160 A1 | 6/2014 | Sidhu |
| 2014/0175644 A1 | 6/2014 | Srinivasan |
| 2014/0264910 A1* | 9/2014 | Razdan ............... H01L 25/0657 257/774 |
| 2014/0268534 A1 | 9/2014 | Sidhu |
| 2014/0353821 A1 | 12/2014 | Yu |
| 2015/0162313 A1* | 6/2015 | Razdan ............... H01L 25/0657 257/738 |

\* cited by examiner

PACKAGE STRUCTURE TO ENHANCE YIELD OF TMI INTERCONNECTIONS

RELATED CASES

The present application is a divisional of and claims the benefit of U.S. patent application Ser. No. 14/198,479, filed on Mar. 5, 2014 and entitled "Package Structure To Enhance Yield of TMI Interconnections", which is incorporated by reference in its entirety.

FIELD OF INVENTION

The field of invention pertains generally to semiconductor die packaging, and, more specifically, to a package structure that enhances the yield of TMI interconnections.

BACKGROUND

A packaging technology referred to as Through Mold Interconnect (TMI) is commonly used in smaller (e.g., mobile) devices to effect tight integration of two separately packaged die into another, larger overall package.

FIG. 1 shows an example of a TMI structure in a package-on-package (PoP) structure. Here, a first packaged die 101 is electrically connected to the substrate 102 of the larger package 103 through coalesced solder balls 104 within respective vias 105 of an encapsulation epoxy mold compound 106. A second semiconductor die 107 resides within the mold compound 106, and, as a consequence, the second semiconductor die 107 is also regarded as "packaged". The overall structure therefore tightly integrates a first packaged die just above a second packaged die.

In a common application, the first packaged die 101 is a memory chip and the bottom semiconductor die 107 is a System-on-Chip (SoC) having one or more processing cores, a memory controller and various I/O units such as a wireless interface unit and a display interface unit. The memory chip is electrically coupled to the memory interface of the SoC's memory controller through the coalesced solder balls 104 and electrical traces within the substrate 102 that are coupled to lands 109 that connect to the memory interface I/Os.

Power and ground are also supplied to the packaged memory chip 101 through other coalesced solder balls 104 that are coupled by traces through lower substrate 102 to the solder balls 110 of the overall package 103. Signaling between the SoC and the system outside the overall package 103 (e.g., signaling to/from a display, signaling to/from wireless antennae circuitry) are carried by traces within the lower substrate 102 between corresponding lands 109 and solder balls 110.

FIGS. 2a and 2b show a prior art method of attaching the first packaged die 201 to the lower substrate 202 (for ease of drawing purposes, various details depicted in FIG. 1 have been omitted from the remaining drawings). As observed in FIG. 2a, the lower substrate 202 as originally manufactured includes lower solder balls 220. The first packaged die 201 likewise includes upper solder balls 221. The upper solder balls 221 of the first packaged die 201 include flux 223 to promote wetting and coalescing of solder balls 220, 221 during attachment of the first packaged die 201 to the lower substrate 202. In order to attach the first packaged die 201 to the lower substrate 202, the first packaged die 201 is initially oriented above the lower substrate 202 such that upper solder balls 220 are aligned above the lower solder balls 221.

As observed in FIG. 2b, the first packaged die 101 is then lowered such that, ideally, solder balls 220 make proximate contact with solder balls 221 with flux 223 between them. A high temperature is applied to reflow solder balls 220, 221 together with flux 223 acting as a promoter of the coalescing. After the reflow and removal of the higher temperature, the solder balls 220, 221 are coalesced to form coalesced solder balls.

FIGS. 3a and 3b depict a problem that has been encountered with the process of FIGS. 2a and 2b (note that the more sophisticated package of FIGS. 3a and 3b includes more than one row of solder ball pairs along the package edge). As observed in FIG. 3a, owing to any/all of solder ball pitch tolerances, solder ball shape differences/imperfections, differences/imperfections in the flatness of the top surface of mold compound 306, imperfections in the flatness of the underside of first packaged die 301, etc. the aforementioned "contact" between solder balls 220 and 221 as depicted in FIG. 2b does not occur across 100% of the solder ball contact pairs. Instead, as depicted in FIG. 3a, some solder ball pairs 320_1, 321_1 will make proper contact while other solder ball pairs 320_2, 321_2 will not make proper contact (or any contact)—at least during initial placement of the first packaged semiconductor die 301 on the lower substrate 302.

During the high temperature reflow, as observed in FIG. 3b, owing at least in part to the softening and deformation of the solder ball pairs 320_1, 320_1 that are in contact, the first packaged semiconductor die 101 typically compresses closer to the lower substrate 102 which can have the effect of causing solder pairs 320_2, 321_2 that were not in contact with one another to finally make contact. Nevertheless, the original lack of contact and/or contamination on solder balls 320_2, 321_2 at the start of the reflow process can cause insufficient wetting of the lower solder ball 321_2 by the flux 323 that was formed on the upper solder ball 320_2.

Specifically, if too much time elapses during the reflow process before the non contacting solder ball pairs 320_2, 321_2 finally make contact with one another, the flux 323 on the upper solder ball 320_2 will compositionally degrade (owing to the higher reflow temperatures). As such, by the time contact is finally made, the flux 323 is no longer capable of properly cleaning the lower solder ball 321_2. The two solder balls 321_2, 322_2 therefore do not coalesce resulting in a bad electrical and physical connection.

Additionally, as observed in FIG. 3b, when the first packaged semiconductor die 301 compresses lower toward the lower substrate 302, the bottom of the first packaged die 301 can make contact with the outer edges 325 of the mold compound 306 which can "close" or otherwise "seal off" previously existing openings 326 (refer to FIG. 3a) that existed between the first packaged semiconductor die 301 and the mold compound 306. These openings 326 permitted the applied heat to easily reach and soften the solder balls 320, 321. After the softening and deformation of the solder balls that were in contact 320_1, 321_1, however, the collapse of the first semiconductor package 301 onto the mold compound 306 and the sealing off of the openings 326 likewise seals off the pathways for the applied heat to reach the solder balls 320, 321. As a consequence, less heat begins to be applied to the solder balls 320_2, 321_2 that have only just came into contact. The application of less heat to solder balls 320_2, 321_2 is believed to further exacerbate the problem of successfully coalescing them.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A solution to the problem described in the background with respect to FIG. 3 is to apply some form of flux to the lower solder ball so that the lower solder ball will be properly cleaned during the high temperature reflow even if no contact is initially made with the flux of the upper solder ball at the start of the high temperature reflow.

Figure 1:
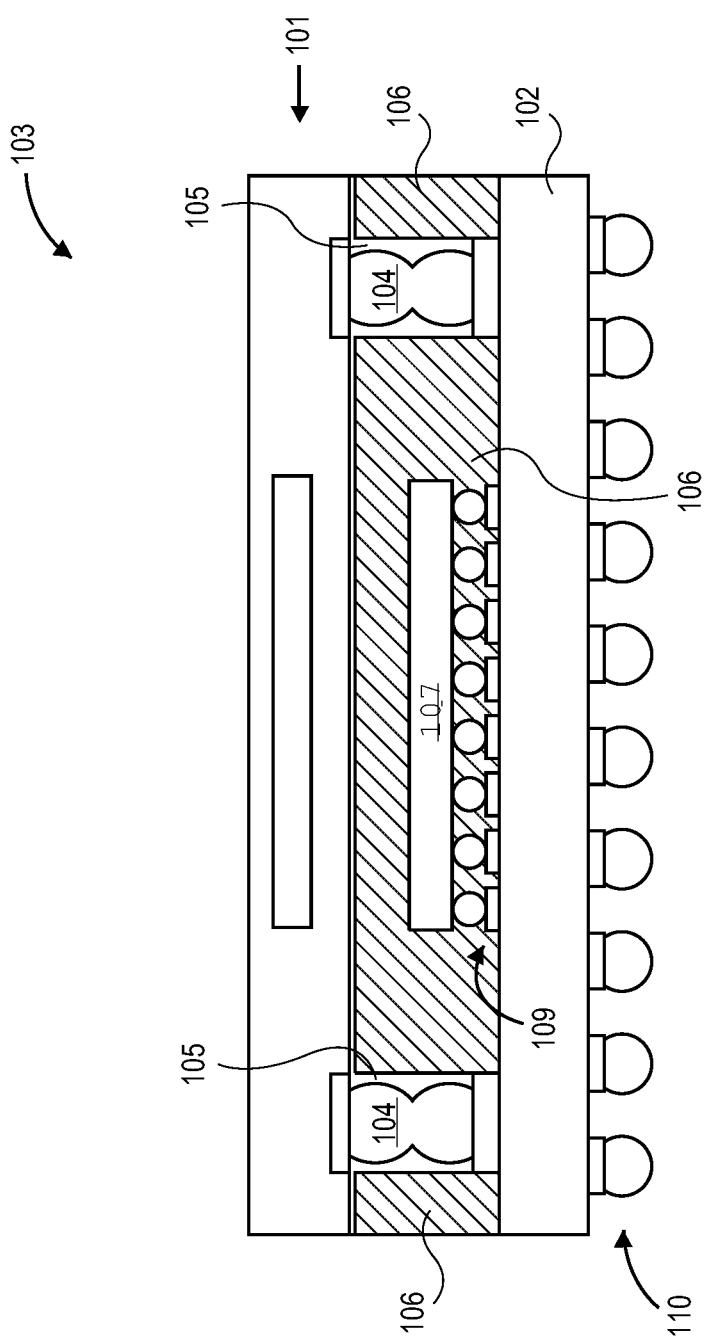
FIG. 1 shows a prior art package-on-package structure.
Figure 2A:
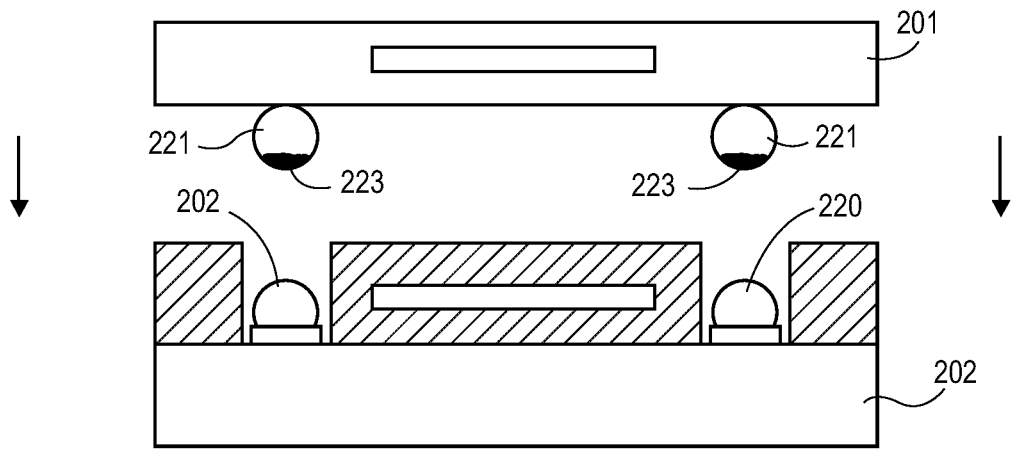
FIGS. 2a and 2b show attachment of an upper packaged die in a package-on-package structure.
Figure 2B:
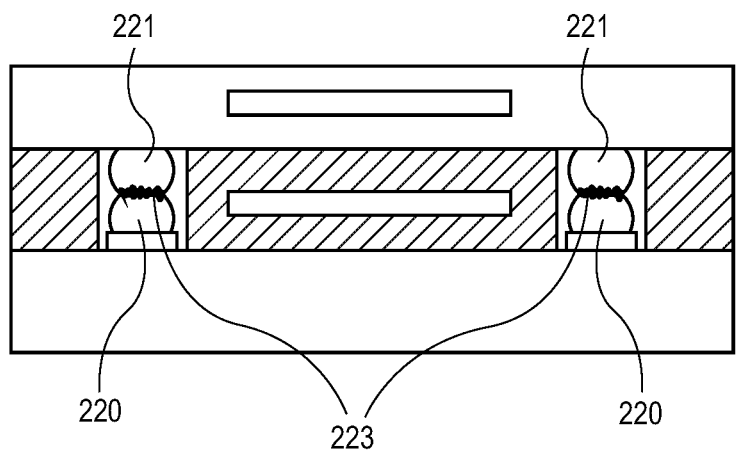
Figure 3A:
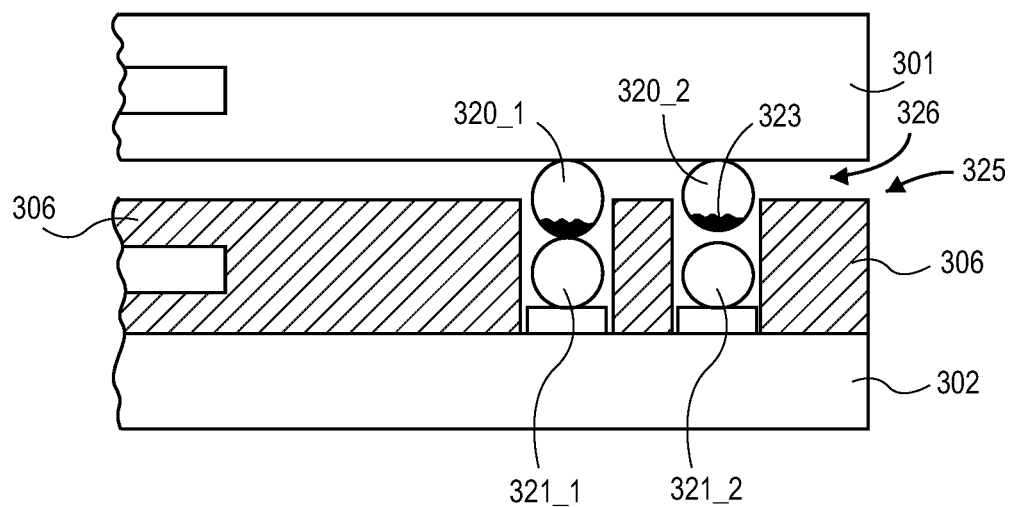
FIGS. 3a and 3b shows a problem with TMI interconnects in a package-on-package structure.
Figure 3B:
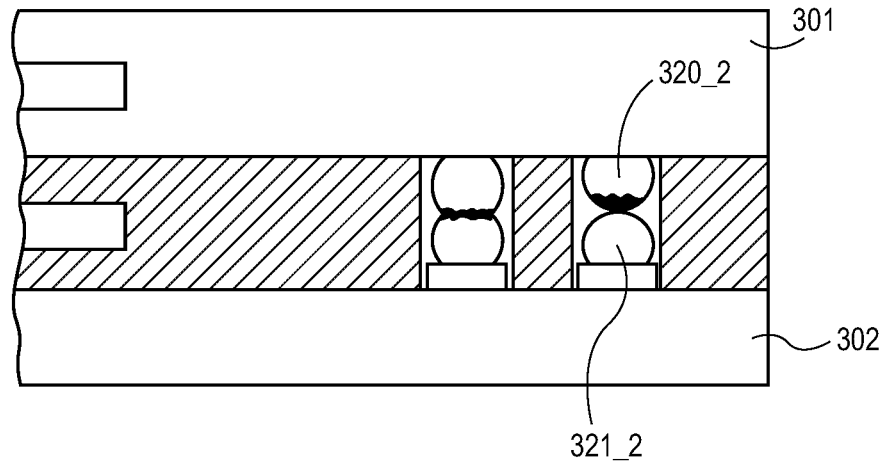
Figure 4A:
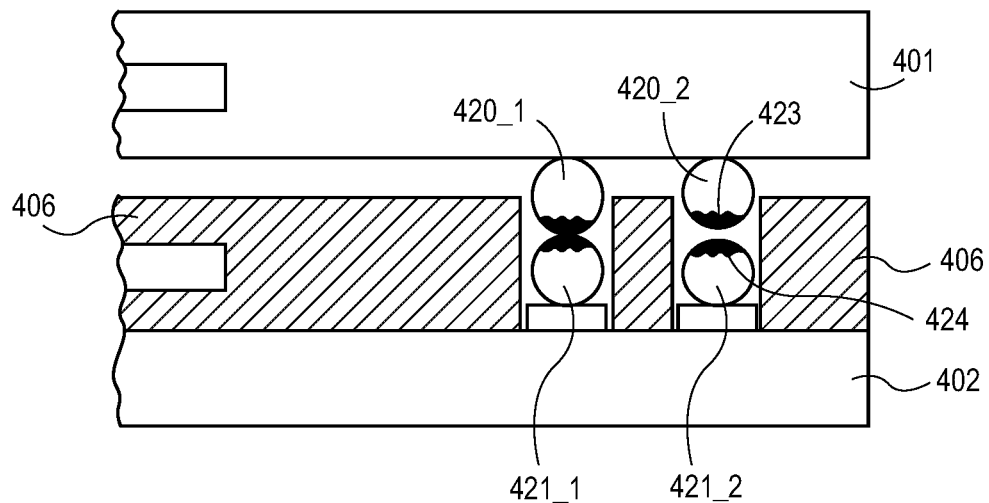
FIGS. 4a and 4b shows a methodology for attaching an upper packaged semiconductor die in a package-on-package structure.
Figure 4B:
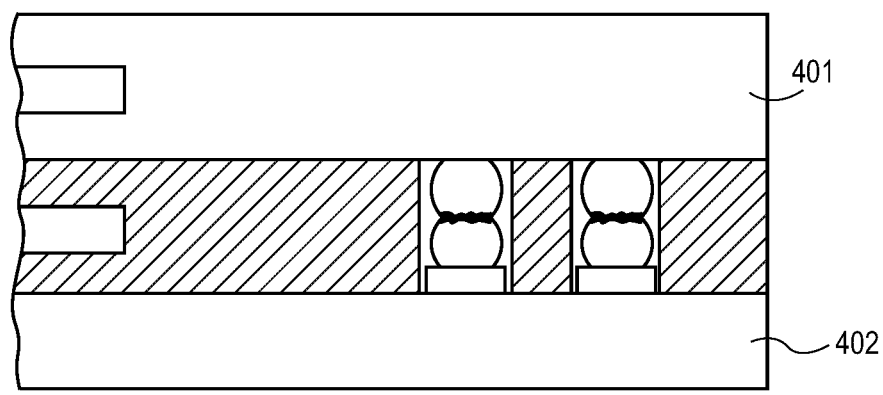

FIGS. 4a and 4b show an example of the new approach that is directly comparable with the original problem presented in FIGS. 3a through 3c of the Background.

As observed in FIG. 4a, again owing to any/all of solder ball pitch tolerances, solder ball shape differences/imperfections, differences/imperfections in the flatness of the top surface of mold compound 406, differences/imperfections in the flatness of the underside of first packaged die 401, etc. some solder ball pairs 420_2, 421_2 will not make proper contact (or any contact)—at least during initial placement of the first packaged semiconductor die 401 on the lower substrate 402.

During the high temperature reflow however, both the upper solder ball 420_2 and the lower solder ball 421_2 of solder ball pairs 420_2, 421_2 that are not originally in contact will properly wet. More specifically, the flux 423 on the upper solder ball 420_2 will wet the upper solder ball 420_2, and, the flux 424 on the lower solder ball 421_2 will wet the lower solder ball 421_2. Again, wetting has the effect of cleaning the surfaces of the solder balls (e.g., removing oxides that have formed on the surfaces) so that when contact is made between them they will properly coalesce.

Referring to FIG. 4b, owing at least in part to the deformation of the solder ball pairs 420_1, 420_1 that are in contact, the first packaged semiconductor die 401 will compress closer to the lower substrate 402. The compression causes previously non-contacting solder pairs 420_2, 421_2 to finally make contact. However, because originally non-contacting solder balls 420_2, 421_2 were properly cleaned by the wetting activity of their respective flux coatings 423, 424 while they were not in contact with each another, they will properly coalesce and form a proper bond.

Here, the flux material has a limited lifetime over which it can properly clean a solder ball surface once the high temperature reflow process has started. In the prior art process of FIG. 3b, lower solder ball 321_2 was denied access to any flux while the flux was within this limited lifetime. As such the lower solder ball 321_2 was not properly cleaned. By contrast, in the approach of FIG. 4b, lower solder ball 421_2 is provided with flux material within the flux material's limited lifetime. As such, lower solder ball 421_2 is properly cleaned and a good connection is formed with the upper solder ball 420_2. The coalesced solder ball pairs will include material from the coating applied to the upper solder ball and material from the coating applied to the lower solder ball.

Figure 5:
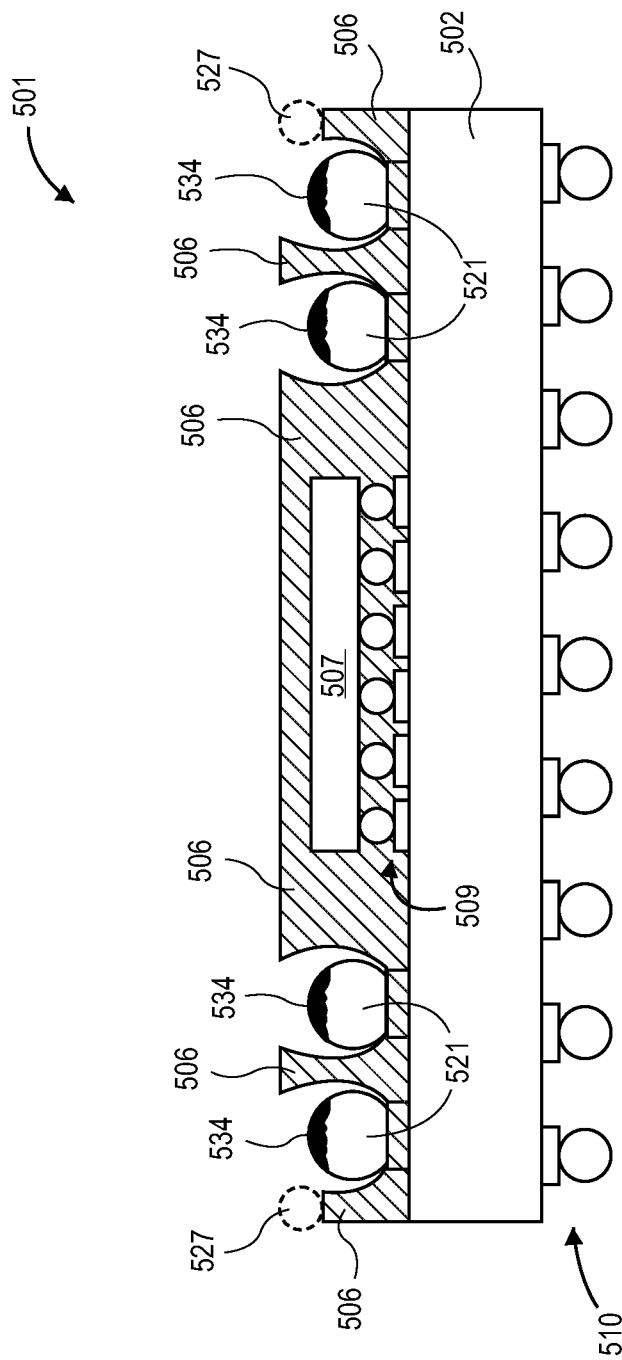
FIG. 5 shows a lower portion of package-on-package substrate having flux disposed on lower solder balls.

FIG. 5 shows an embodiment of a packaged semiconductor die 501 and lower substrate 502 having the lower solder balls 521 for a through mold interconnect. Here, as just one example, the packaged semiconductor die 501 can be further processed to include attachment of another packaged die to form a PoP structure as discussed above. As observed in FIG. 5, the packaged semiconductor die 501 includes a semiconductor die 507 encased within a mold compound 506 upon a lower substrate 502.

The lower substrate 502 may be formed of any standard PC board material such as alternating layers of a patterned copper conductors (traces) and a variety of insulators such as an epoxy and fillers such as glass, silica, or other materials. The lower substrate 502 is typically a multi-layer structure having internal electrical traces that couple a portion of lands 509 to I/O balls 510 as appropriate with the overall electrical design of the packaged die. Another portion of lands 509 are coupled to lower solder balls 521 through internal traces of the lower substrate 502. Some portion of lower solder balls 521 may also be directly coupled to I/O balls 506 by way of traces within lower substrate 502.

Importantly, each of the lower solder balls 521 have been coated with flux material 534 to promote TMI attachment as described above with respect to FIGS. 4a and 4b. In an embodiment, the characteristics of flux material 534 are specially chosen to meet the specific environmental conditions that the overall packaged die structure 501 of FIG. 5 may be subjected to after its construction leading up to the moment the upper packaged die is attached. In certain circumstances the environmental conditions may last for an extended period of time and may include applications of high temperatures.

As an example, the structure 501 of FIG. 5 may be shipped to a system manufacturer who attaches the upper packaged die of the PoP structure when building the complete system. As such, the structure 501 of FIG. 5 may sit in storage for extended periods of time (e.g., between the time it is manufactured to the time it is shipped to the system manufacturer). Additionally, some system manufacturers may prefer to apply an elevated temperature to the structure 501 of FIG. 5 prior to the start of the TMI reflow attachment process (e.g., to remove any moisture that is contained within the structure).

The flux material 534 that is applied to the lower solder balls 521 therefore, in various embodiments, should be able to "last" so as to preserve its ability to actively cleanse the lower solder ball even after extended storage periods and/or applications of elevated temperatures. The ability to "last" brings forward a few considerations.

One possible consideration is that the flux material 534 should "keep its shape" during extended periods of storage. As such, the flux material 534 should be solid (relatively hard or more viscous). Said another way, if the viscosity of the flux material 534 is too low the shape of the flux material 534 may gradually change over time as it flows down the sides of the lower solder ball. In some embodiments, for example, the viscosity should be above 250 Poise.

Another possible consideration is that the flux material 534 should be clear or relatively transparent (e.g., so that the lower solder ball beneath the flux material can be seen from above the TMI via). Clarity permits, for example, automated manufacturing equipment with "visioning" capability to "see" or otherwise detect the location of the underlying solder ball.

Another possible consideration is the "active potential and the wetting properties" (hereinafter, simply "active potential") of the flux material. Here, any flux material can be seen as composed of agents (e.g., rosins) that will chemically react with and cleanse the lower solder ball during wetting for the TMI reflow process for attachment of the upper packaged die. The ability of these agents to react as desired with the lower solder ball during the TMI reflow is therefore a measure of the "active potential" of the flux material. Here, if some percentage of the agents become neutralized or otherwise ineffective while the packaged die is in storage, the "active potential" of the flux material will decay over time while the packaged is in storage.

The problem described above with respect to FIG. 3 of the Background section essentially occurs because the "active potential" of the flux material 323 on upper solder ball 320_2 is substantially lost by the time the upper solder ball 320_2 finally makes contact with the lower solder ball 321_2. It is therefore prudent to choose a flux material 534 that will retain a sufficient composition of agents that are still useable for their intended purpose by the time the TMI reflow process begins.

According to one embodiment, the "active potential" characteristic of the flux material is addressed by using a flux material whose agents do not substantially react with the lower solder ball at temperatures beneath the flux activation temperature used during the TMI reflow process or any other elevated temperature that is applied to the structure (e.g., a system manufacturer moisture removing bake process). For example, if the typical reflow process will provide sufficient dwell time at a temperature in the 150° C. to 180° C. range for flux activation and then additional time at a temperature of approximately 240° C. for solder joint formation, a flux material 534 is chosen whose agents do not substantially react with the lower solder ball at temperatures below 150° C. In this case, reaction of the agents with the lower solder ball during storage at room temperature is negligible and the "active potential" of the flux does not substantially diminish during storage.

FIGS. 6a through 6e show a process for forming the flux material on the lower solder ball that takes into account at least some of these considerations. Again, certain details depicted shown in FIG. 5 have been deleted for the sake of illustrative ease. As observed in FIG. 6a, during one stage of the packaged die's manufacturing process, the die 610 and lower solder balls 621 are affixed to the lower substrate 602 and the mold compound 606 is applied so as to cover the die 601 and the lower solder balls 621.

Figure 6A:
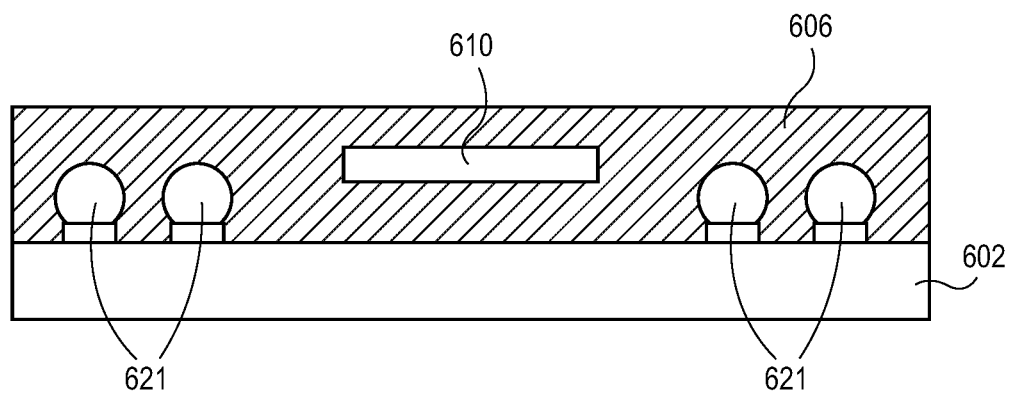
FIGS. 6a through 6e show a method for forming the structure of FIG. 5.
Figure 6B:
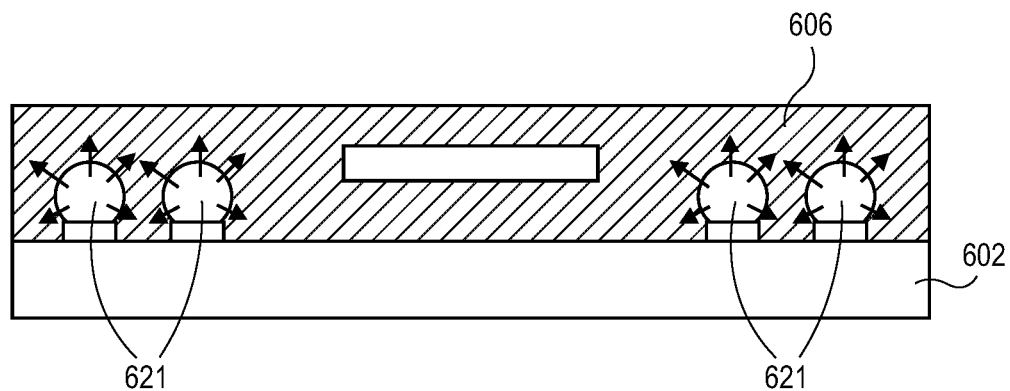

As shown in FIG. 6b, a high temperature (e.g., 220-260° C.) is applied to the structure of FIG. 6a. The lower solder balls 621, being metallic or metallic-like, expand outward relative to the mold compound 603 in response. In one embodiment the high temperature causes the solder balls to change from a solid phase to a liquid phase which, in an unconstrained environment, would cause an expansion in the size of each solder ball by approximately 4.3% (by volume at atmospheric pressure). Since solder is a material that has a positive coefficient of expansion when changing from a solid phase to a liquid phase, the applied heat and liquidation of the solder ball causes it to expand and apply outward pressure to the mold compound when it is full encapsulated by the mold compound. The pressure induced by the outward expansion of the solder balls 621 increases the size of the cavity within the mold compound 606 where the solder balls reside.

Figure 6C:
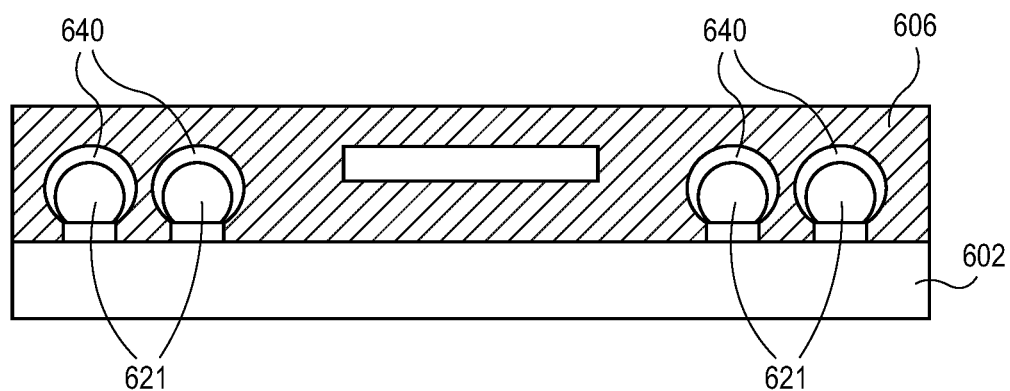

As shown in FIG. 6c, the high temperature is then removed which causes the solder balls to rapidly shrink (e.g., as part of a phase change from a liquid phase back to a solid phase). The expanded cavity formed within the mold compound 606 remains however which forms openings ("micro-channels") 640 within and along the interface of the mold compound 606 that surrounds the lower solder balls 621. The micro-channels 640 provide pathways for moisture or other "volatiles" to evaporate from or otherwise escape the structure during subsequent application of any elevated temperatures without damaging the solder balls 621 or the mold compound 606.

Figure 6D:
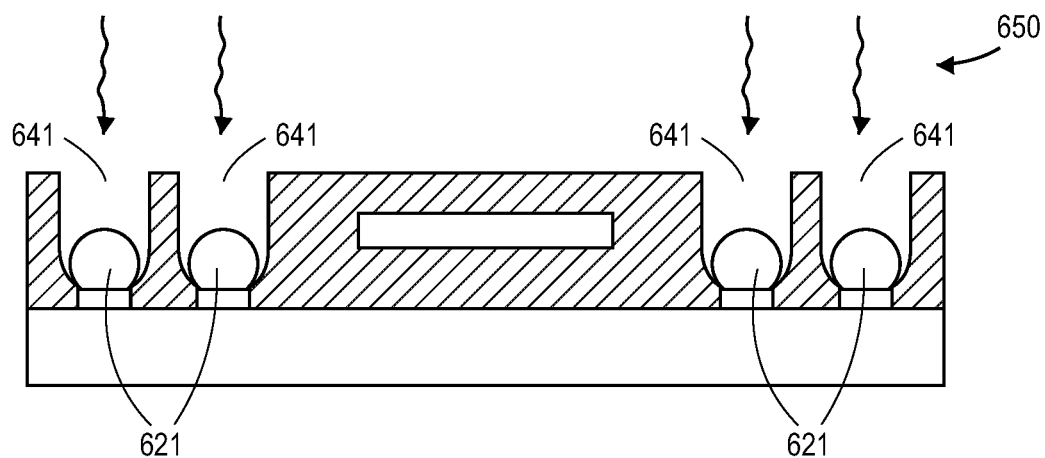

As shown in FIG. 6d, a laser 650 is used to form vias 641 above the lower solder balls 621. Although the laser 650 can be applied so as to extend the vias all the way to lower substrate 602, in an embodiment, the laser is applied so as to extend the vias only to waist height (point of largest diameter) of the lower solder balls 621. Alternate embodiments may extend the via anywhere beneath the waist of the lower solder ball to the lower substrate 602. Even more expansively, the laser may stop being applied above the waist of the solder ball (e.g., so that the just the region to be wetted is exposed). Various embodiments may extend the via to any desired depth. In the typical industry art, via openings necessarily penetrate fully or nearly the entire depth of the mold compound to provide an escape path for volatiles. This approach is not needed in embodiments that expand the solder ball to create micro-channels as discussed above.

Figure 6E:
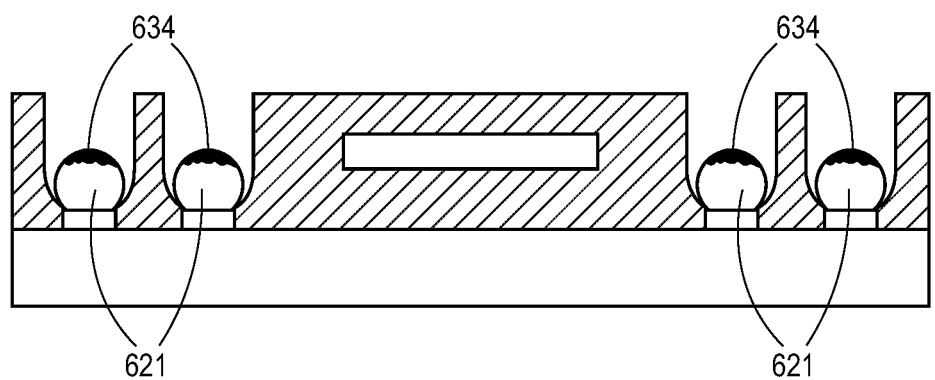

As shown in FIG. 6e, the flux material 634 is then applied to the top surfaces of the lower balls 621. The flux material 634 can be applied by dispense, print, vapor deposition, dip, spray, spin-coat, brush, sputter, etc.

After the flux material 634 is applied to the lower solder balls 621, an elevated temperature is then applied (e.g., 125° C.) to cure the flux material 634. The curing of the flux material 634 helps remove solvent additives within the flux 634 that were added to reduce the viscosity of the flux 634 for its application to the surface of the lower solder balls 621. Said another way, with the solvent additives the flux 634 is more liquid-like, which, in turn, makes it easier to apply the flux 634 to the surface of the solder balls 621. The subsequent curing substantially removes these solvent additives which, in turn, hardens the flux material 634 consistent with the first consideration discussed above (that the flux material 634 should be solid).

Here, the elevated temperature used during the curing process should be substantially less than the temperatures used during the actual TMI reflow process so that the rosins or other active agents in the flux 534 can be designed to substantially react with the solder ball surface during the TMI reflow process but not during the cure. In embodiments where the TMI reflow process is performed at 200° C. or above (e.g., 240° C.), the curing process is performed at temperatures at or below 125° C., and the flux is designed to not substantially react with the lower solder ball at temperatures below 150° C. or higher.

The lower solder ball coat materials can be designed in various embodiments to accommodate the assembly of low temperature metallurgies (melting temperature of about 140 C.°) currently being evaluated in the surface mount industry.

In an embodiment, the flux, prior to the cure (e.g., during its dispensation on the lower solder ball) is composed of rosin (e.g., within a range of 20 wt % to 90 wt %) and solvent additives (discussed above) to promote more viscous behavior of the flux during dispensation. The rosin may include a combination of one or more rosin systems (e.g., rosin esters, hydrogenated rosin resins, dimerized rosin resins, modified rosin resins). In various embodiments, the solvents have a volatization temperature above 60° C. in order to ensure they will vacate the flux during the curing process temperatures.

Other embodiments may additionally add either or both of amines and acids. As is known in the art, amines will help clean the surface of a solder ball during wetting and thus can be viewed as another agent that contributes to the "active potential" of the flux. As such, the amines should be designed to not react with the lower solder ball at the curing temperature or other applied temperatures beneath those used by the TMI reflow process. In various embodiments the amines may include primary, secondary, and tertiary amines comprising 4 to 20 carbons (e.g., butyl amine, diethylbutyl amine, dimenthylhexyl, and the like or their combinations).

Acids may also be included as reactive agents that add to the "active potential" of the flux (that react with the lower solder ball to clean it). Here, if less active long chain rosins are included in the flux, more active short chain acids can be added to enhance the reaction activity of the flux. Again, the acids should be chosen so that they do not react with the lower solder ball at temperatures beneath the TMI reflow process. In various embodiments organic acids may be used such as mono, di, and tri carbolic acids comprising between 2 and 20 carbons (e.g., glycolic acid, oxalic acid, succinic acid, malonic acid and the like or their combinations).

Recall from the discussion of FIG. 3 that another problem with the present TMI reflow attach process is that the collapse of the first packaged semiconductor die 301 on top of the mold compound 306 blocks off heat pathways 326 making it more difficult to coalesce the solder ball pairs 320_2, 321_2 that were originally not in contact with one another.

FIG. 5 additionally shows an improved structure that attempts to rectify this problem by removing upper edge material 527 of the mold compound. With upper edge material of the mold compound being removed, permanent heat pathways to the solder balls are effectively designed into the mold compound 506 irrespective of the positioning of the first packaged semiconductor die. That is, when the first packaged semiconductor die collapses onto the surface of the mold compound 506, open heat pathways to the solder balls still exist and are not sealed off. Thus heat continues to be applied to the solder ball pairs that only come into contact with one another after the collapse of the first packaged semiconductor die making it easier to coalesce them.

Figure 7A:
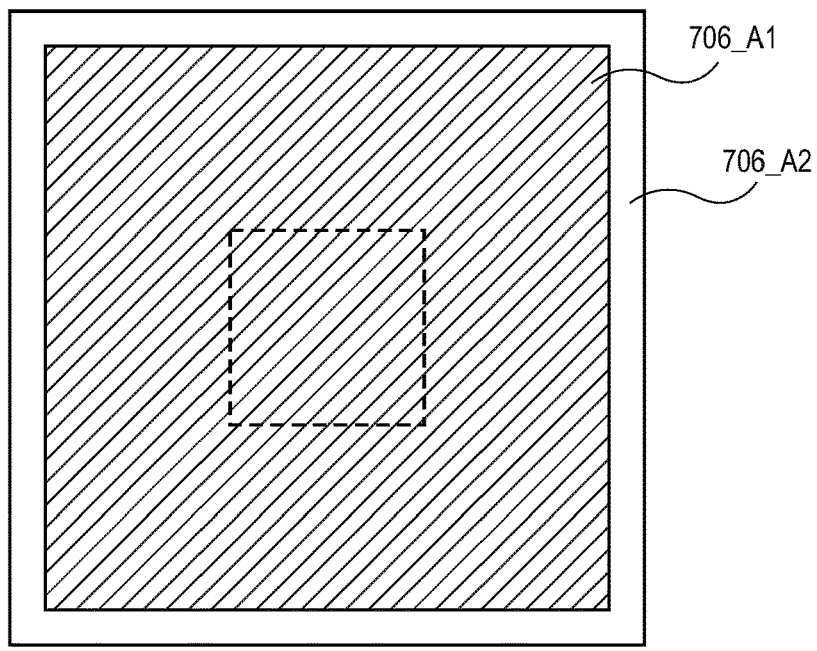
FIGS. 7a through 7d show different embodiments for upper edge mold compound material removal.
Figure 7B:
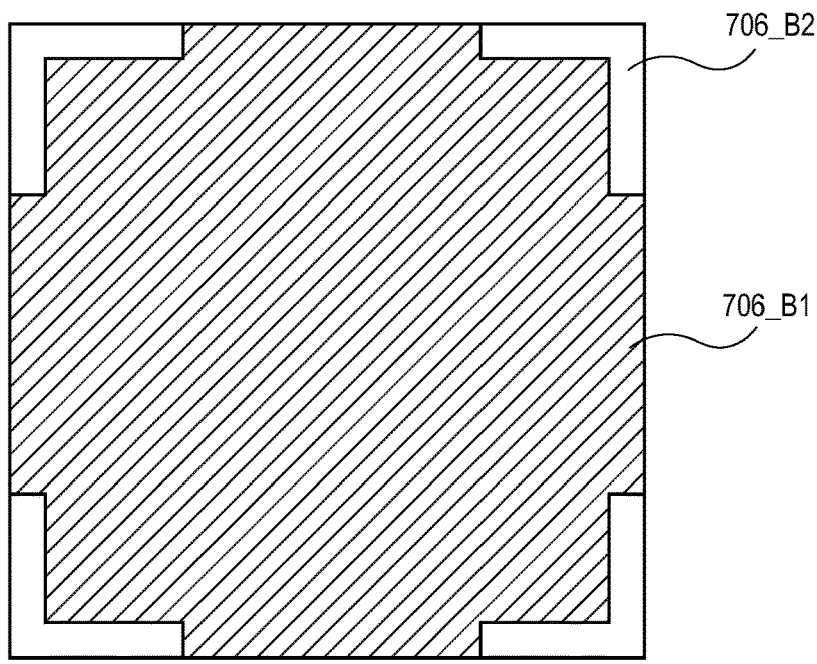
Figure 7C:
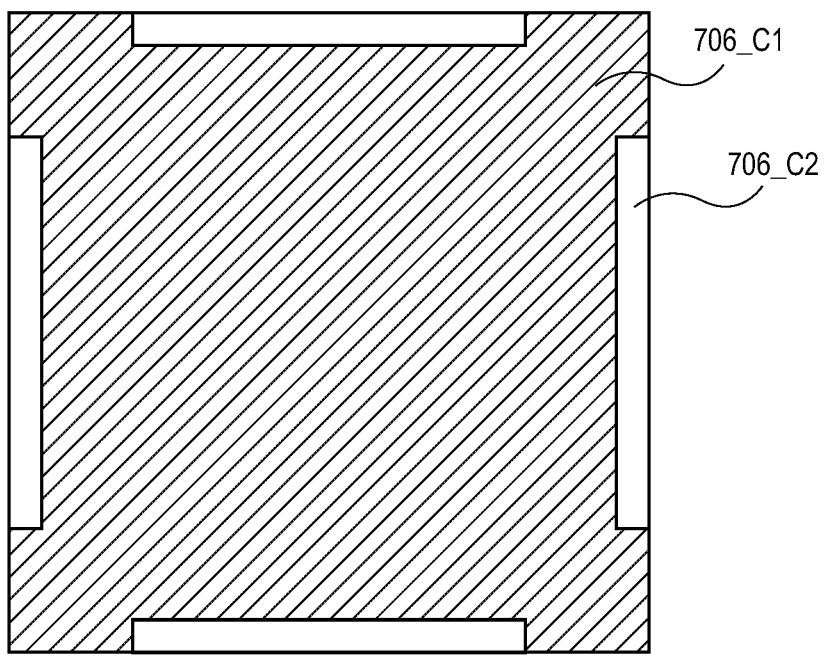
Figure 7D:
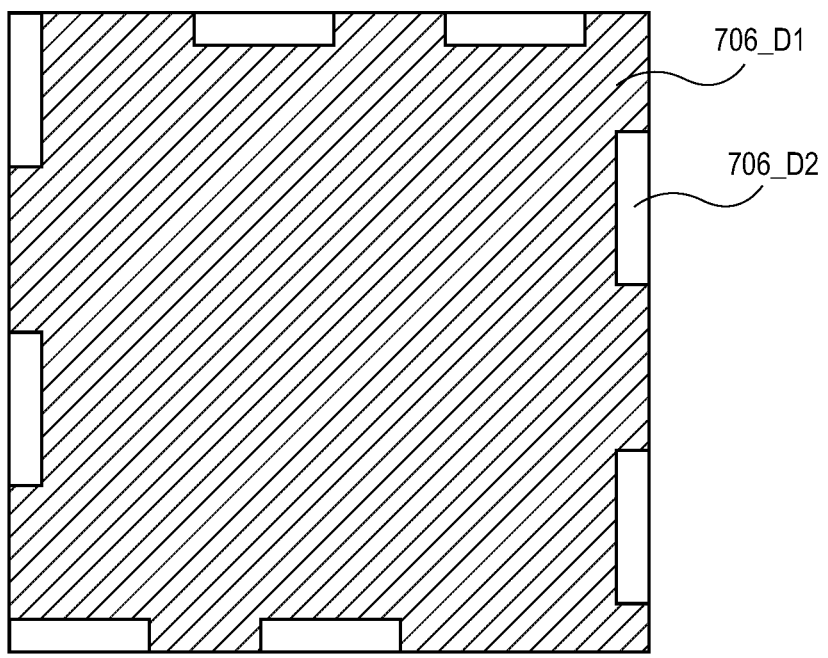

FIGS. 7a through 7d show top-down perspectives for various embodiments where edge material of the mold compound is removed. For ease of drawing the vias for the solder balls are not depicted. FIG. 7a shows a "full removal" embodiment where all upper edge material of the mold compound is removed. Here, region 706_A1 corresponds to the full height region of the mold compound while region 706_A2 corresponds to regions of the mold compound having reduced height due to the upper edge material removal. FIG. 7b shows a "corner removal" embodiment where upper edge material is only removed at the corners (again, Here, region 706_B1 corresponds to the full height region of the mold compound while region 706_B2 corresponds to regions of the mold compound having reduced height due to the upper edge material removal). FIG. 7c shows upper mold compound edge material along the sides. FIG. 7d shows an inter-stitched pattern.

Note that inner areas of the mold compound and certain edge regions of the mold compound in the embodiments of FIGS. 7b through 7d still keep the full height of the mold compound to effectively act as studs or supports for the first packaged die that will not substantially change its original height positioning as compared to the prior art approach.

Compound mold material may be removed at the edges with a laser such as the laser that is used to form the vias over the lower solder balls. As such, upper edge material removal make be performed commensurate with the process depicted in FIG. 6d. The amount of material removed can be controlled by altering the laser property settings (e.g., power, frequency, speed, and focus). The additional laser exposure of the solder balls increases the risk of contaminating the ball surface. In order to avoid such contamination, a low power laser may be used first to ablate the mold closest to the solder balls. Then a higher power laser is applied to add increased depth to the upper edge material removal.

Although the above discussion has focused on a layer of "flux" on the lower solder ball the teachings discussed herein can be applied just as well to other types of coatings used to assist the coalescence of two solder balls. Examples include, just to name a few, organic polymer network based coatings (such as an Organic Solderability Preservative), resin/rosin based systems, powder based coatings (e.g., powdered acid and amine compounds), active adhesive films/laminates, elastomers, sol gel type matrixes and wax based coatings to name a few. Like the flux discussed above, any of these types of coatings can be used to clean the surface of the lower solder ball during a high temp TMI reflow process yet at the same time be designed to not react with lower temperature cure processes or other bake procedures that take place prior to TMI reflow. Likewise these same types of coatings can be made sufficiently hard consistent with the teachings above so as to substantially retain their shape during long periods of storage.

Conceivably, the coating materials described herein can be further optimized to eliminate the need for the upper solder ball dippable fluxes or solder pastes currently used to attach the upper (e.g., memory) component by way of TMI and/or make the mount process less sensitive to the amount and/or "goodness" of the flux transferred onto the TMI balls by the upper solder ball.

Lastly, even though the above discussion has been directed to the use of "solder balls", processes that employ other connectivity structures may benefit from the teachings of the instant application. As such, it is believed that flux material may be applied to any lower connectivity feature (e.g., ball, column or pads) made of any of a wealth of metallic and/or metallic-like conductive materials (e.g., solder, copper, conductive polymer, copper coated with solder, conductive polymer coated with solder).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:
1. A method, comprising:
forming a mold compound over a die, a lower solder ball and a multi-layered substrate, said die being bonded to said multi-layered substrate, said lower solder ball being bonded to said multi-layered substrate;
forming a via in said mold compound over said solder ball to expose said solder ball;
forming a solid coating on said solder ball, said solid coating to promote wetting of said solder ball; and
subsequent to forming said solid coating on said solder ball, bonding said solder ball to another solder ball.

2. A method, comprising:
forming a mold compound over a die, a lower solder ball and a multi-layered substrate, said die being bonded to said multi-layered substrate, said lower solder ball being bonded to said multi-layered substrate;
applying an elevated temperature to cause said solder ball to change from a solid phase to a liquid phase and cause said solder ball to expand thereby exerting outward pressure on said mold compound where said mold compound interfaces to said solder ball;
applying a lowered temperature to cause said solder ball to retract thereby leaving a micro-channel between said solder ball and said mold compound where said mold compound interfaced to said solder ball at said elevated temperature; and
forming a via in said mold compound over said solder ball to expose said solder ball.

3. A method, comprising:
forming a mold compound over a die, a lower solder ball and a multi-layered substrate, said die being bonded to said multi-layered substrate, said lower solder ball being bonded to said multi-layered substrate; and
reducing a thickness of said mold compound at a periphery of said multi-layered substrate to provide a permanent heat pathway between said periphery and said solder ball.

* * * * *